United States Patent [19]
Wang

[11] Patent Number: 5,962,922
[45] Date of Patent: Oct. 5, 1999

[54] CAVITY GRID ARRAY INTEGRATED CIRCUIT PACKAGE

[76] Inventor: Bily Wang, No.13, Lane 17, Alley 99, Pu-Ding Road, Hsin-Chu, Taiwan

[21] Appl. No.: 09/040,472

[22] Filed: Mar. 18, 1998

[51] Int. Cl.[6] .......................... H01L 23/48; H01L 23/52; H01L 29/40

[52] U.S. Cl. .................... 257/773; 257/774; 257/698; 257/692; 174/263

[58] Field of Search ..................... 257/774, 773, 257/698, 692, 768, 784, 700, 723; 361/767, 774; 174/262, 263, 265

[56] References Cited

U.S. PATENT DOCUMENTS

| | | |
|---|---|---|
| 4,664,962 | 5/1987 | DesMarais, Jr. . |
| 5,315,072 | 5/1994 | Arai et al. . |
| 5,404,044 | 4/1995 | Booth et al. . |
| 5,406,034 | 4/1995 | Frei et al. . |
| 5,541,368 | 7/1996 | Swamy . |
| 5,689,091 | 11/1997 | Hamzehdoost et al. . |
| 5,783,865 | 7/1998 | Higashiguchi et al. . |

*Primary Examiner*—Sheila V. Clark
*Attorney, Agent, or Firm*—H. C. Lin

[57] ABSTRACT

A flat package for integrated circuit chip has a substrate with plated through holes. The top flange of a plated through hole is interconnected to a terminal of the IC chip. The bottom flange of the through hole has a cavity recessed into the substrates. A solder is placed between a circuit contact on a mother board and the bottom flange. Upon heating, the solder rises to fill the cavity, to make connection between the terminal on the IC chip and the contact on the mother board.

6 Claims, 13 Drawing Sheets

Top View

Side View

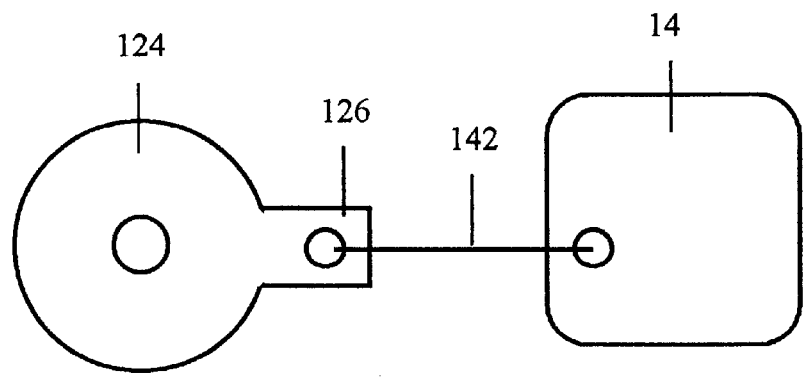
Top View
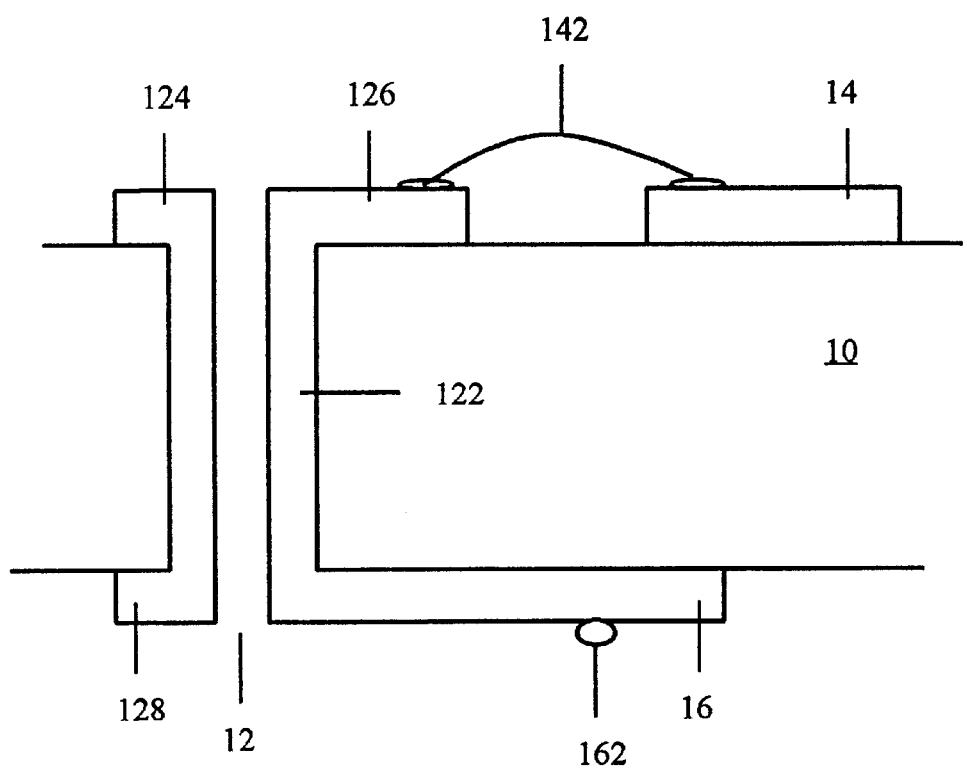
Side View
Fig. 1 Prior Art

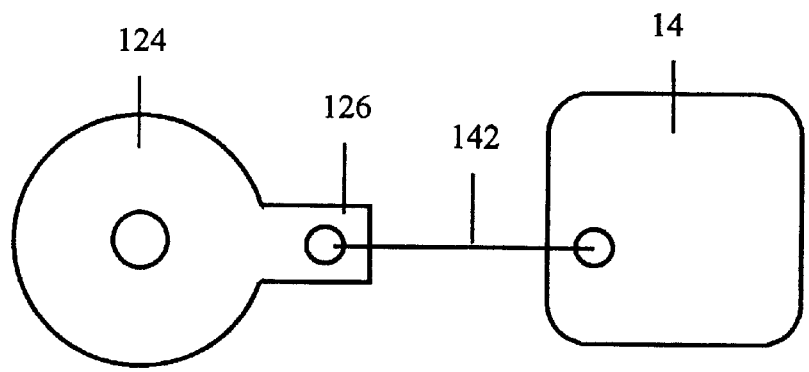
Top View
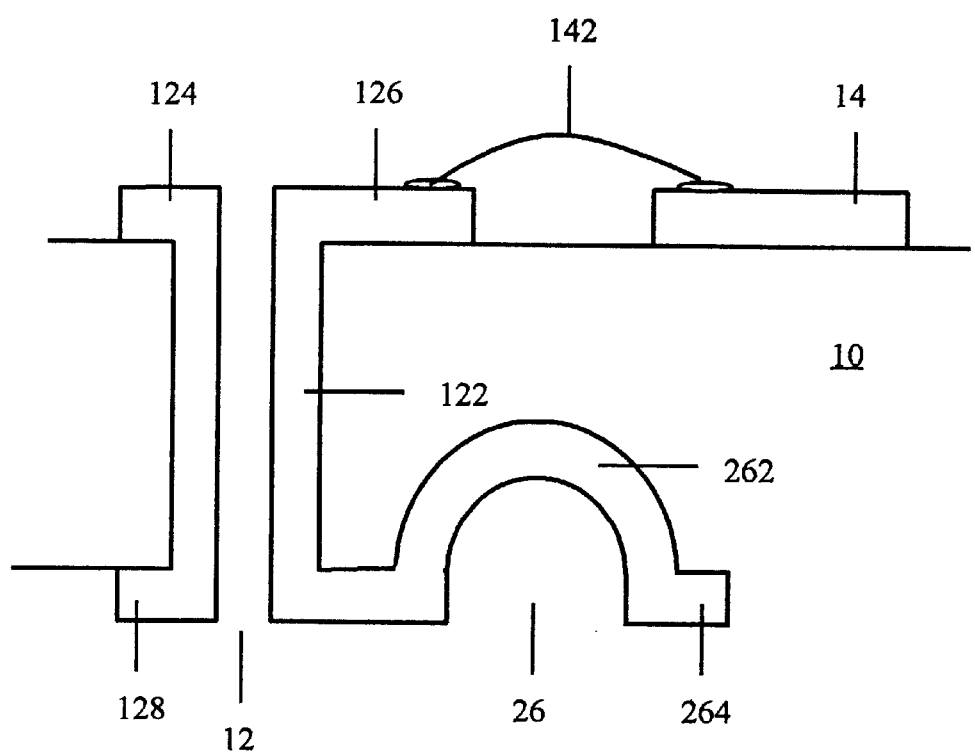
Side View
Fig. 2

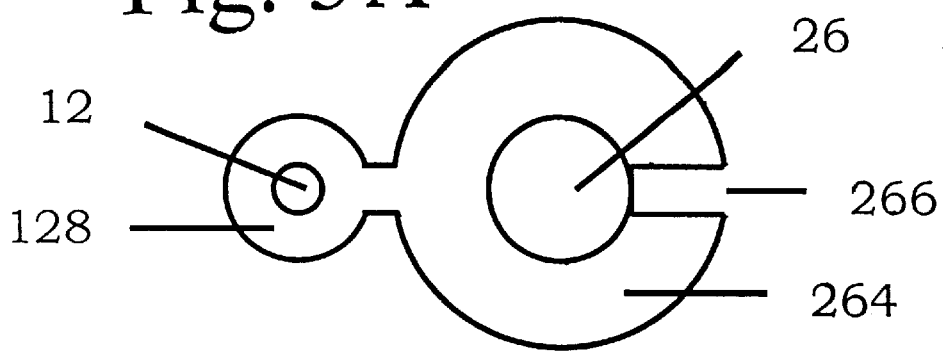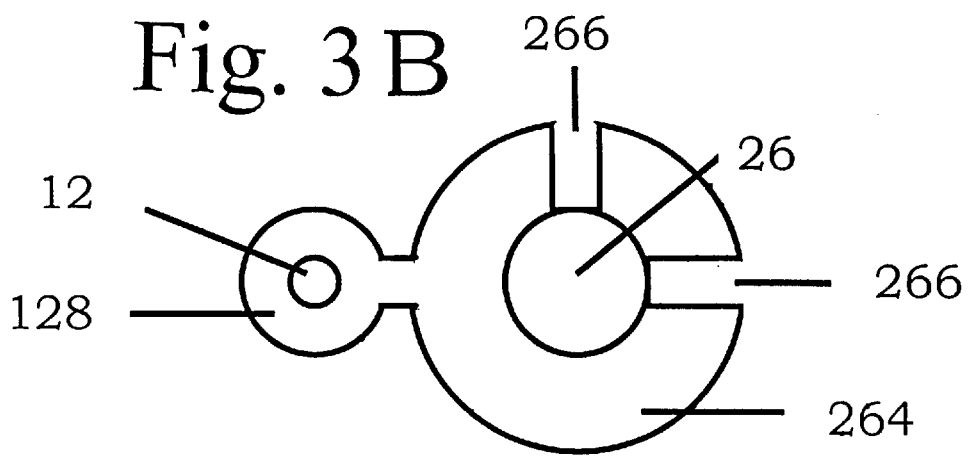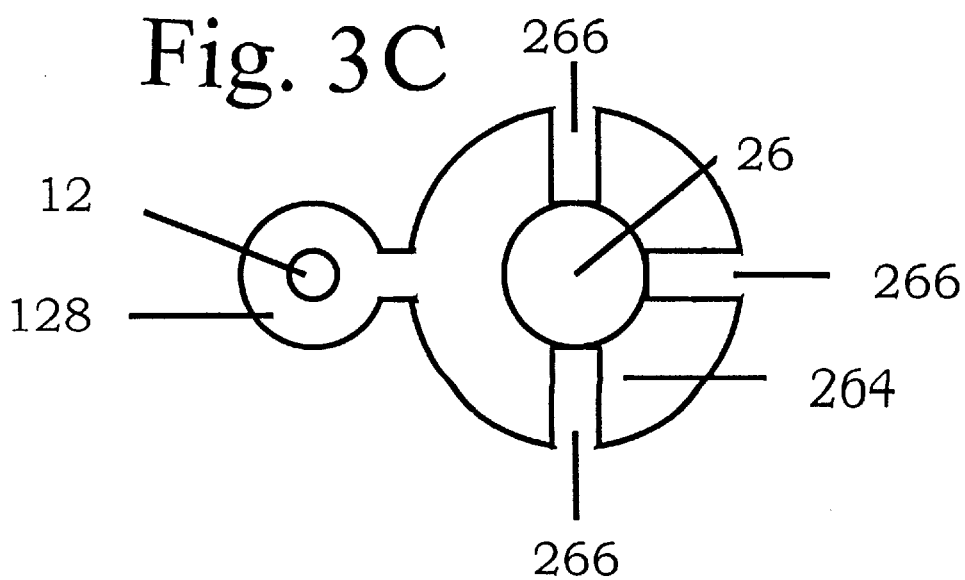

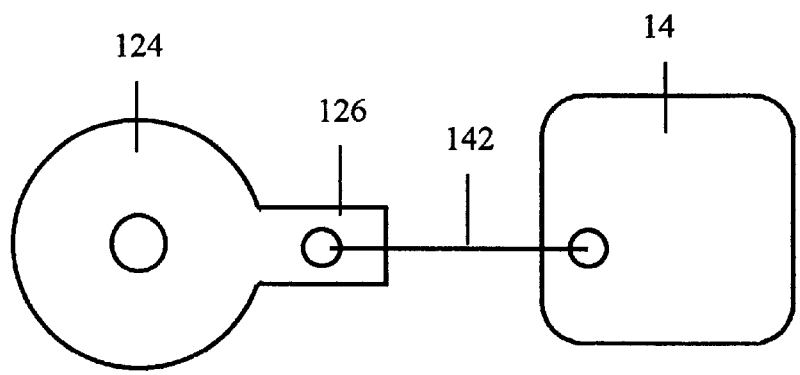
Top View
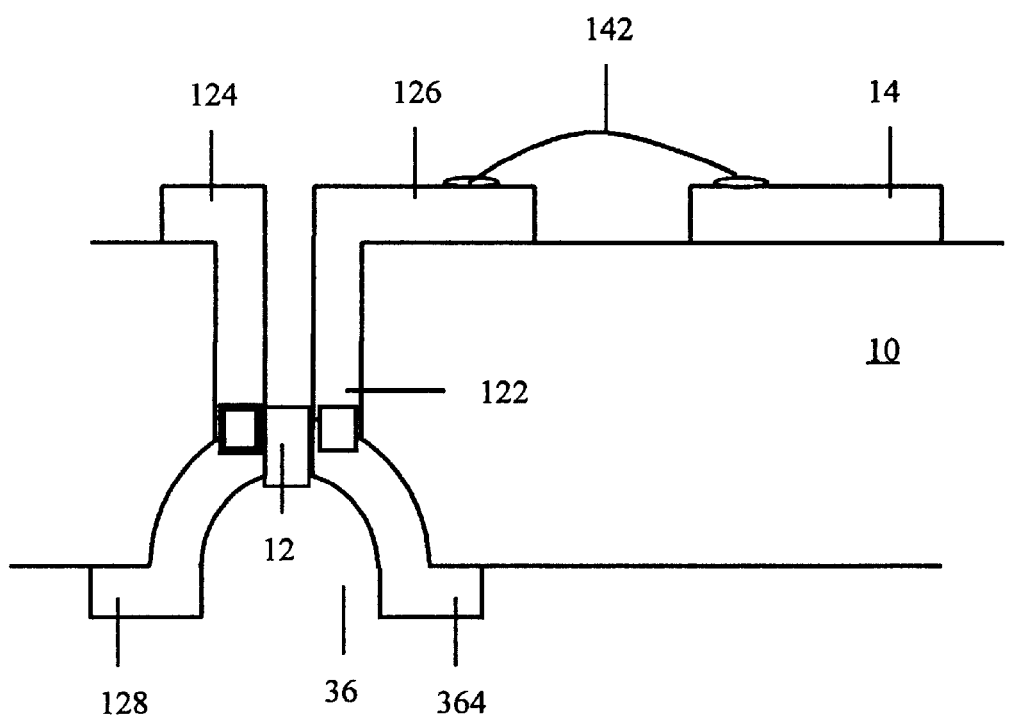
Side View
Fig. 6

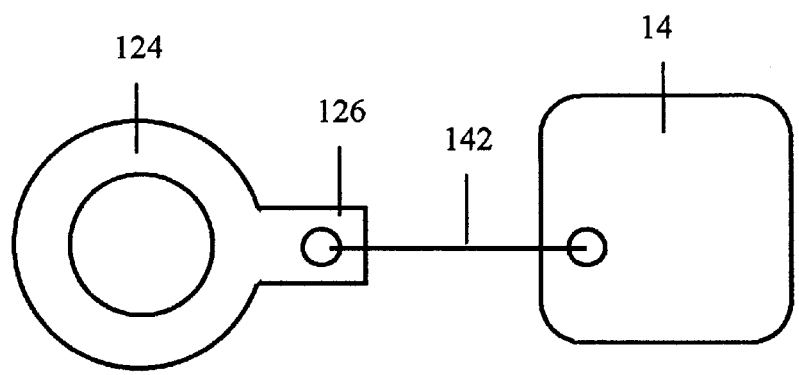
Top View
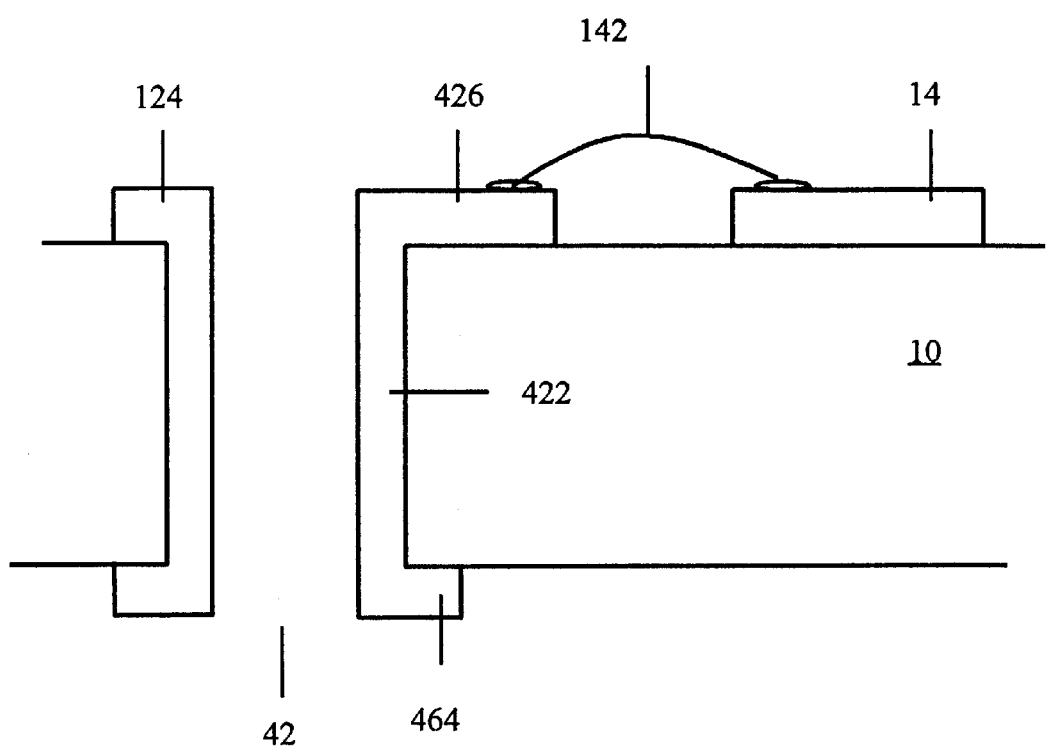
Side View
Fig. 10

CAVITY GRID ARRAY INTEGRATED CIRCUIT PACKAGE

BACKGROUND OF THE INVENTION

This invention relates to integrated circuit package, in particular flat paks.

As integrated circuit (IC) progresses, the tendency is to increase the number the pins in an IC package. Up to now, as many as four hundred pins have been used. As the number of pins increases, packaging techniques face increasing complexity and difficulty. To overcome the problem, most packaging techniques use a printed circuit board as a carrier for the IC chip. A popular packaging technique is the Ball Grid Array (BGA). However, the BGA has many shortcomings:

(1) Soldering Ball: High soldering ball production equipment cost and maintenance cost.

(2) Planting the Soldering Ball: High soldering ball planting equipment and maintenance cost.

(3) Material Cost: High soldering ball cost.

SUMMARY

An object of this invention is to reduce the cost of the soldering ball production equipment and maintenance. Another object of this invention is to reduce the cost of planting the soldering balls. Still another object of this invention is to reduce the cost of the soldering balls.

These objects are achieved in this invention by using a novel Cavity Grid Array (CGA) package. This package has high pin counts. A printed circuit substrate it. used as a carrier for integrated circuits chips. The substrate has two-sided printed circuits, and plated through holes to interconnect the two sides. One side of the substrate has bonding pads coupled to input and output terminals. The other side of the substrate has unique cavities to couple to the mother board. This package can overcome most of the shortcomnigs of the prior art BGA package.

BRIEF DESCRIPTION OF THE DRAWINGS

FIG. 1 shows a prior art BGA package cross section.

FIG. 2 shows the cross section of the present invention.

FIGS. 3A, 3B, 3C show three versions of the first embodiment.

FIG. 6 shows a second embodiment of the present invention.

FIG. 10 shows a third embodiment of the present invention.

DETAILED DESCRIPTION OF THE PREFERRED EMBODIMENT

Figure 4:
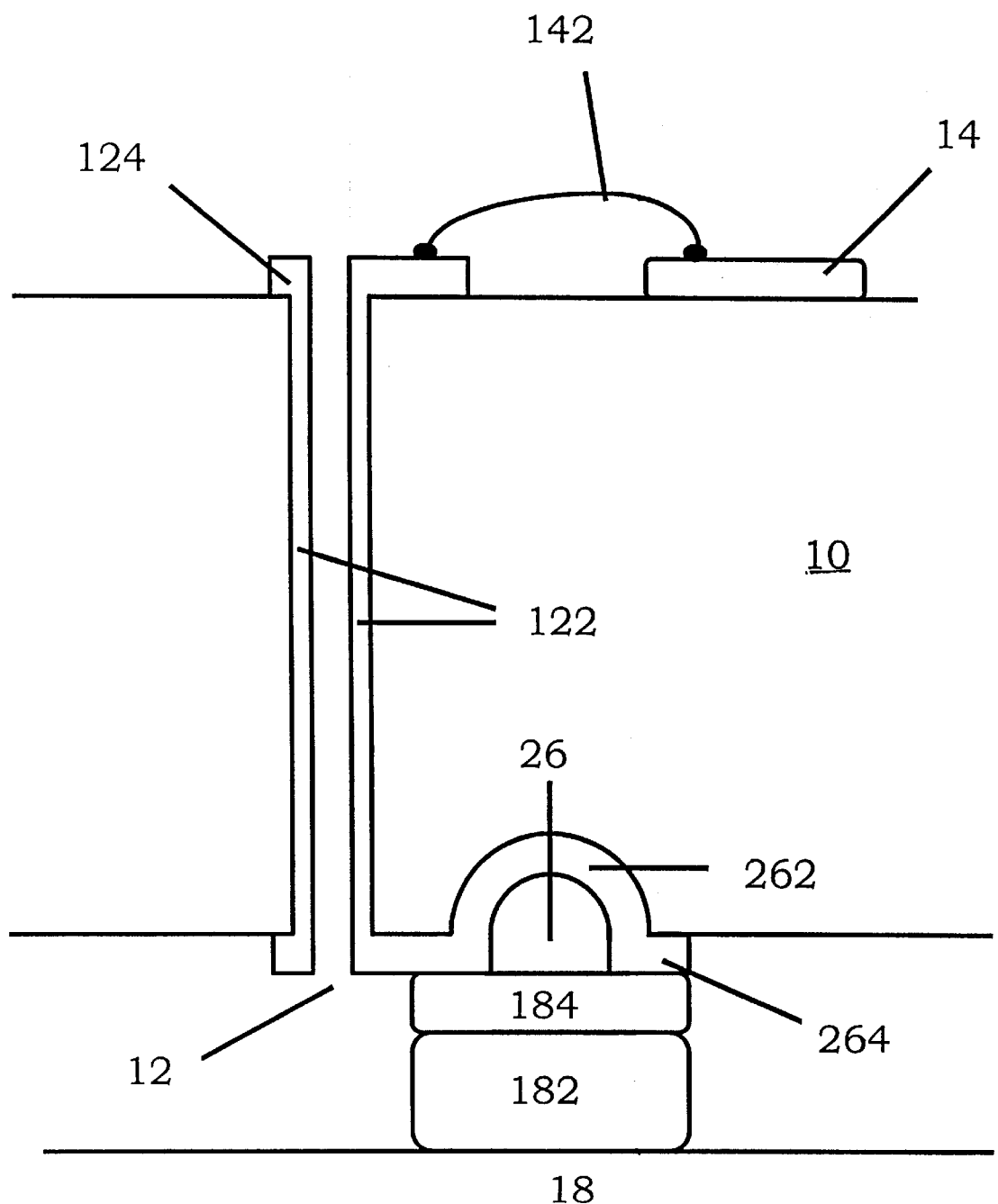
FIG. 4 shows the attachment of the package to a mother board.

FIG. 1 is a cross-sectional view of a conventional beaded grid array (BGA). The printed circuit board 10 has plated "through holes" 12. The surface of the through hole is plated with conducting material 122. The ends 124 of the through hole 12 has flanges extending to the surfaces of the substrate 1 like a washer. The upper flange has a conducting soldering pad 126 for coupling to an output terminal of an IC chip 14 mounted on the substrate 10. Thus the output terminal 14 is connected to the lower side of the substrate 10. The connection 142 between the output terminal of the IC chip 14 and the soldering pad 126 is made by wire bonding or flip chip techniques. The other end of the via hole terminates in the same manner with a flange 128 and a soldering pad 16. A soldering ball 16 is planted on the soldering pad 16.

FIG. 2 is a cross-sectional view of the present invention. The surface of the plated through hole 12 is covered with conducting material 122. The toss end of the plated through hole 122 has a similar construction as the conventional structure shown in FIG. 1 with corresponding reference numerals. However, the bottom side of the through holes 122 is different from FIG. 1. Instead of a flat soldering pad, a cavity 26 is recessed into the substrate 10. The recessed cavity 26 is coated with conducting material 262 and continues to form a rim, 264 at the feat surface. The cavity 26 serves as a soldering terminal for the mother board.

FIG. 3 shows three different constructions of the recessed cavity 26. In FIG. 3A, a cut 266 is made at the rim 264. In FIG. 3B, there are two cuts 266 in the rim 264. In FIG. 3C, there are three cuts 266 in the rim 264. These cuts are provided to let out air during soldering.

FIG. 4 shows the first step before soldering the substrate 10 to the mother board 18. The mother board has a circuit contact point 182. A soldering material 184 is sandwiched between the contact 182 and the conducting rim 264, which has a shape matching that of the contact point 182 but not limited to a circular shape.

Figure 5:
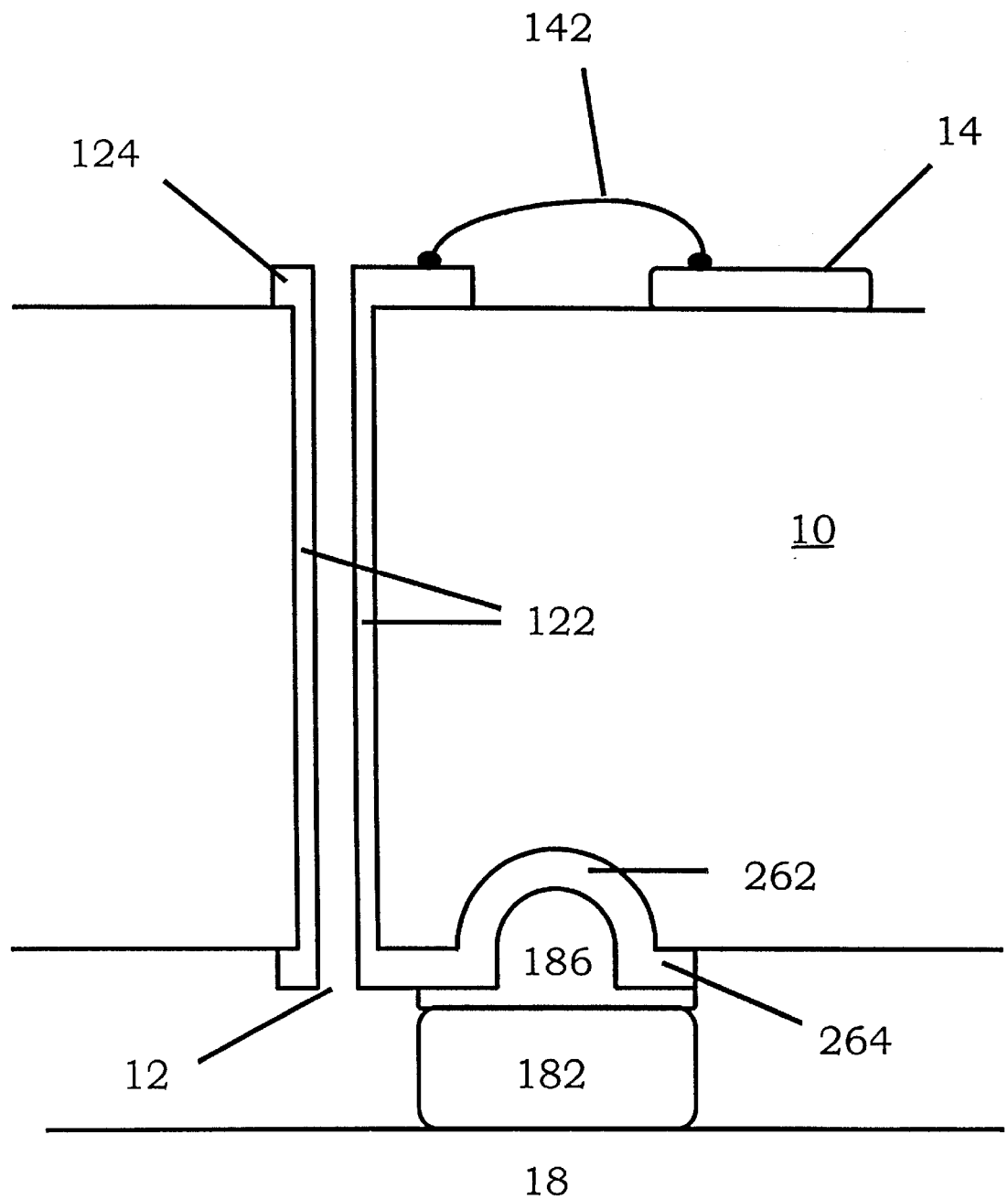
FIG. 5 shows the attachment after heat treatment
Figure 7A:
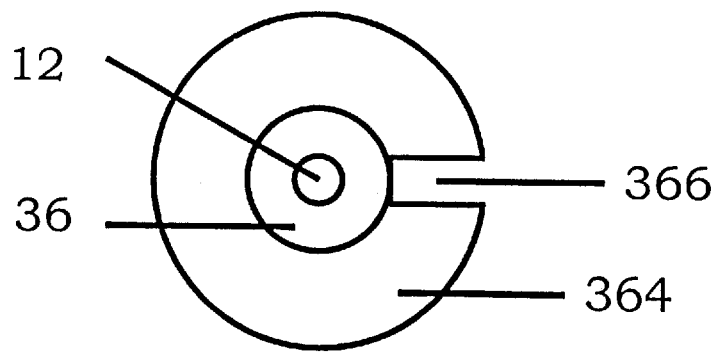
FIGS. 7A, 7B, 7C, 7D show four different implementations of the second embodiment.
Figure 7B:
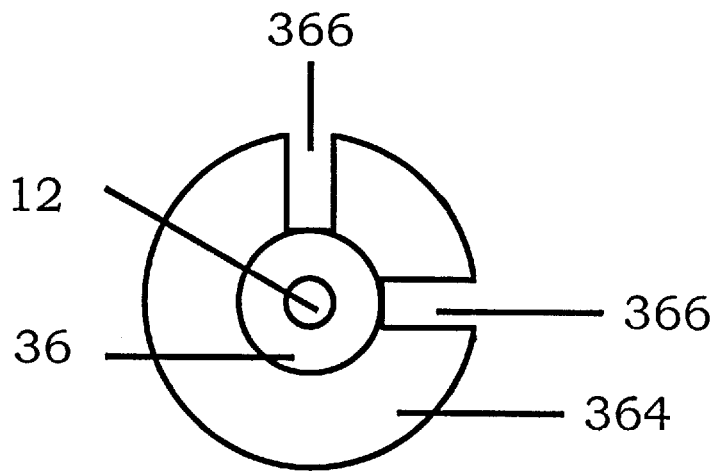
Figure 7C:
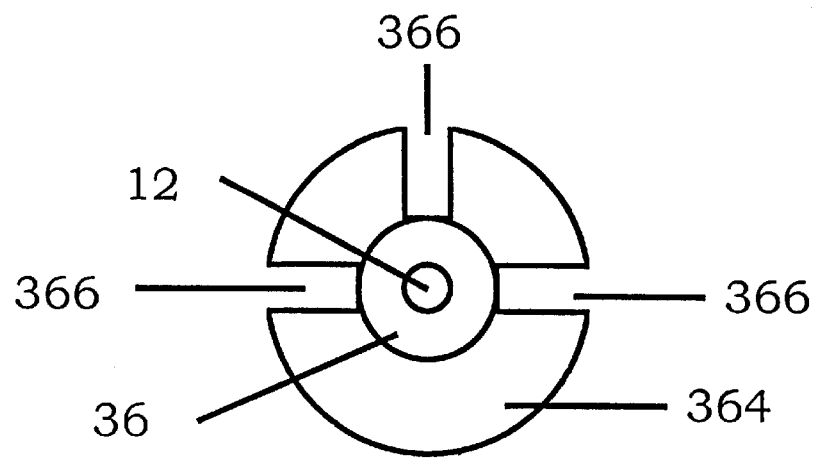
Figure 7D:
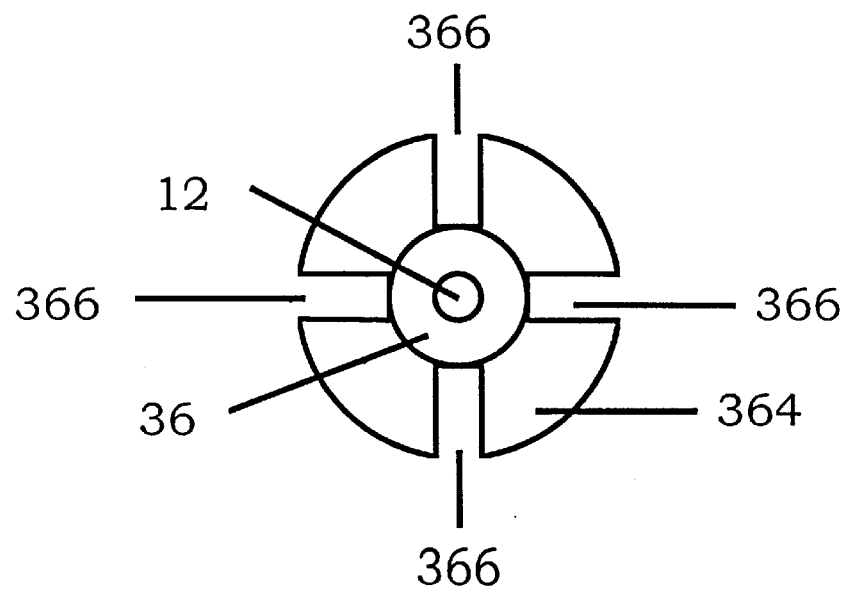

FIG. 5 shows the soldering material 184 in FIG. 4 has been melted after heat treatment to form a dome 186 to fill the cavity 26 in FIG. 2. The output of terminal of the IC 14 is thus connected to the mother board.

FIG. 6 shows another embodiment of the present invention. The openings at the two ends of the plated through hole 122 are unequal in size. The bottom opening is larger and forms a cavity 36. The edge of the cavity is coated with conducting material 364 with a rim overlapping the substrate 10.

FIGS. 7A, 7B, 7C and 7D show the rim 364 in FIG. 6 has one, two, three and four nonconducting cuts in the rim respectively to let air out during soldering. Higher number of cuts lets the air out more easily.

Figure 8:
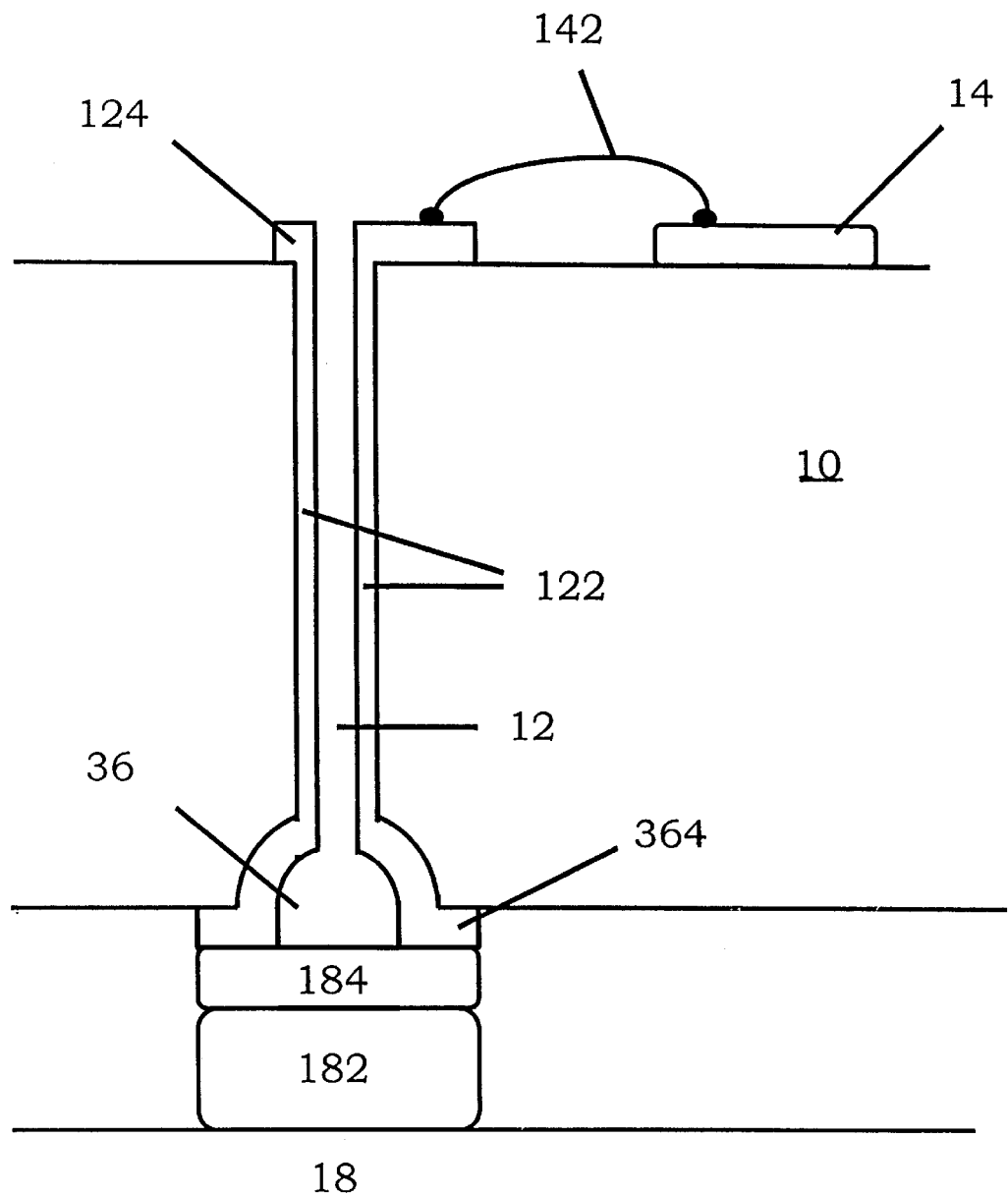
FIG. 8 shows the attachment of the second embodiment to the mother board before soldering

FIG. 8 shows the first step before soldering the substrate through hole 1 conducting rim 364 shown in FIG. 6 to the substrate mother board 18. A soldering material 184 is sandwiched between a circuit contact point 182 and the rim 364 of the cavity 36. The shape of the soldering material 184 is not limited to the circular shape shown and may assume a shape which matches best with the contact point 182.

Figure 9:
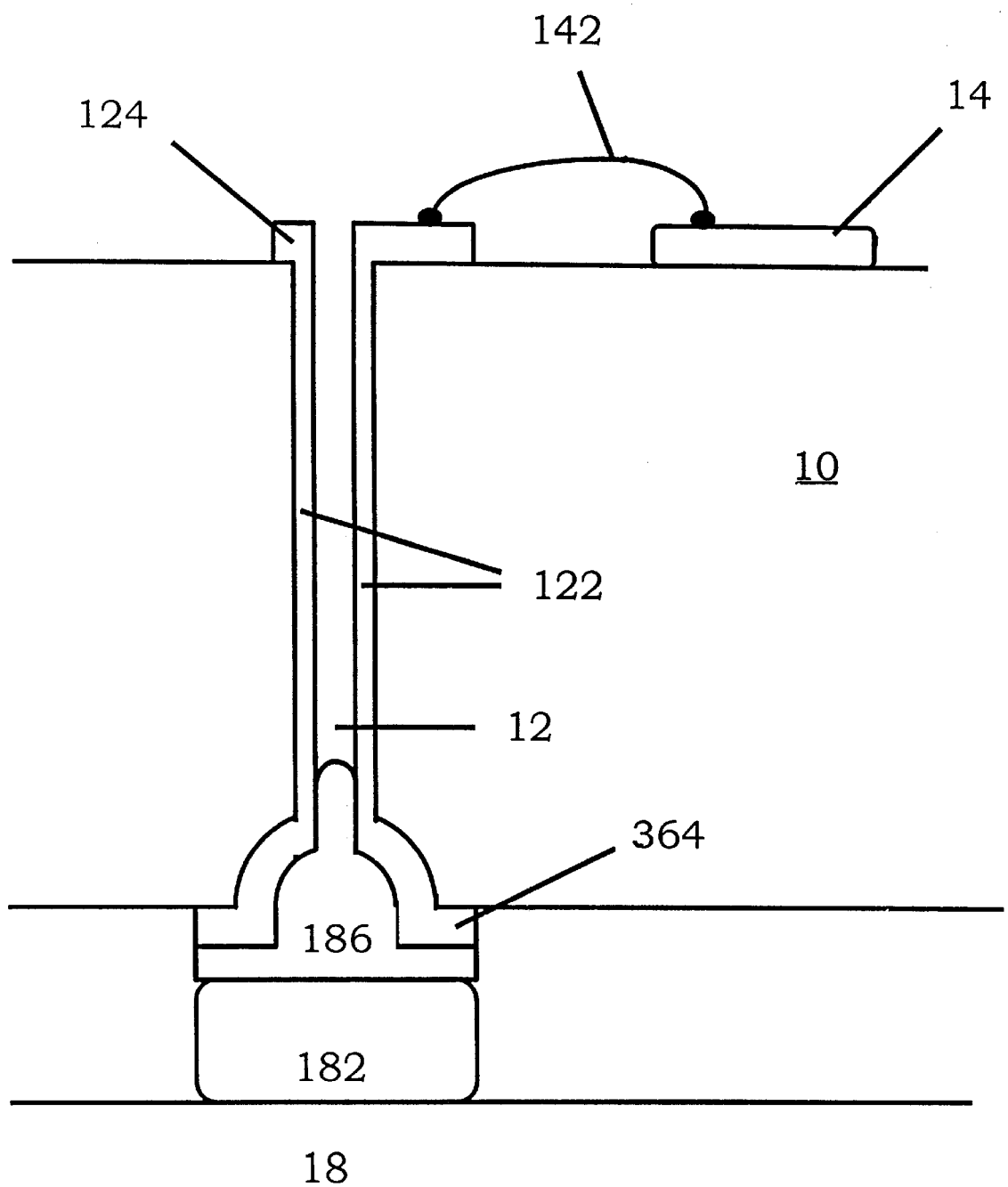
FIG. 9 shows the attachment to the mother board after heat treatment.

FIG. 9 shows the shape of the soldering material 186 after heat treatment. The solder 184 in FIG .6 now encroaches toward the through hole 12 and fills up the cavity 36 shown in FIG. 8.

FIG. 10 shows a third embodiment of the present invention. The cross-section 42 of the through hole is enlarged to a dimension comparable to that of the cavity shown in FIG. 8. Thus the through hole 42 serves the same function as the cavity 36 in FIG. 8. The bottom end of the through hole 42 has a conducting rim 464, which serves the same function as the rim 264 in FIG. 4 The dimension of the rim mates with that of a circuit contact on the mother board. The conducting rim may also have more than one cut as shown in FIGS. 7A, 7B, 7C and 7D to let air out during soldering.

Figure 11:
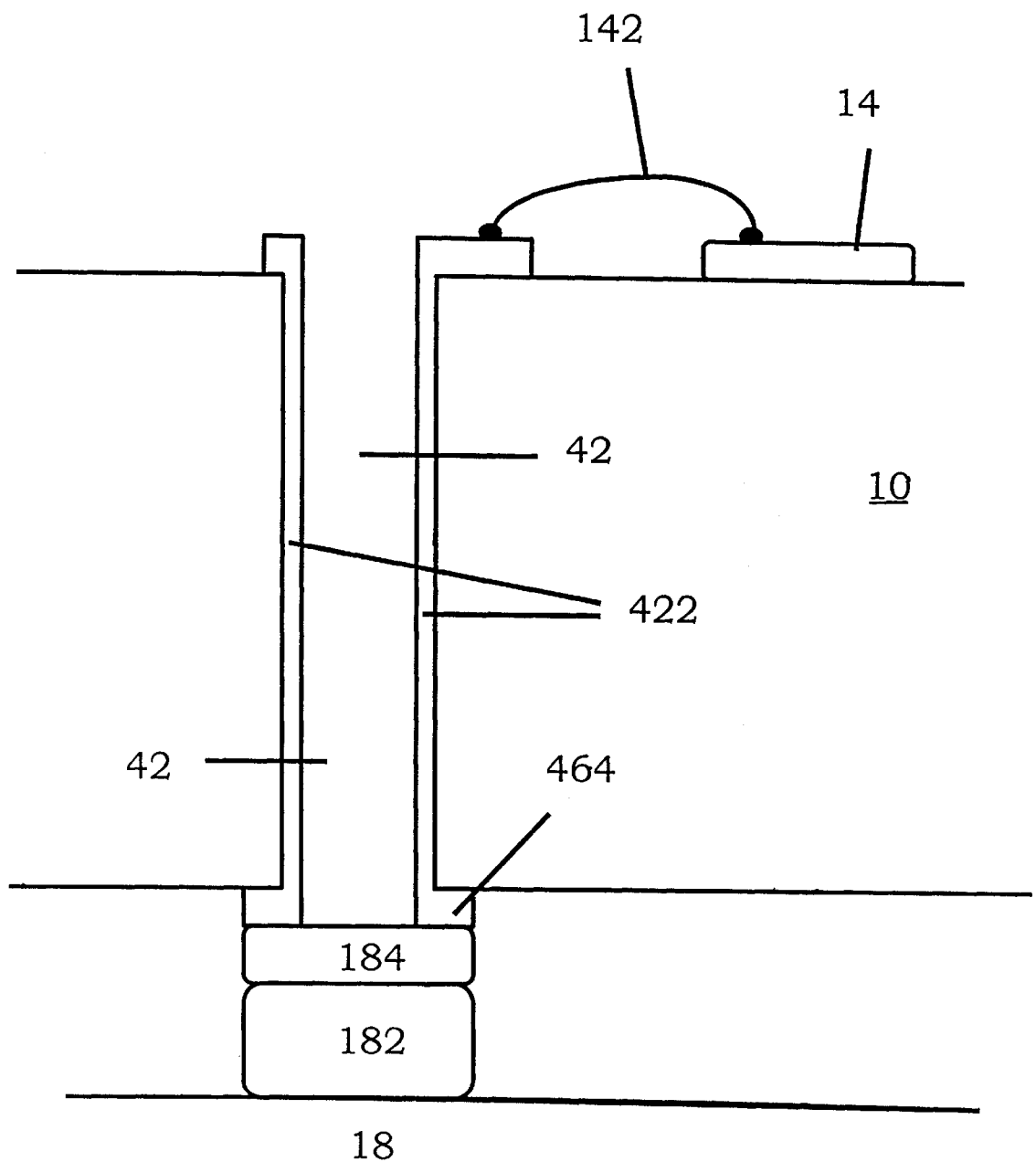
FIG. 11 shows the attachment of the third embodiment to the mother board before soldering.

FIG. 11 shows the placement of a soldering material 184 sandwiched between the rim 464 and a circuit contact 182 on the mother board 18. The shape of the conducting rim is not limited to a circular shape, and should assume a shape which makes best contact to the circuit contact 182.

Figure 12:
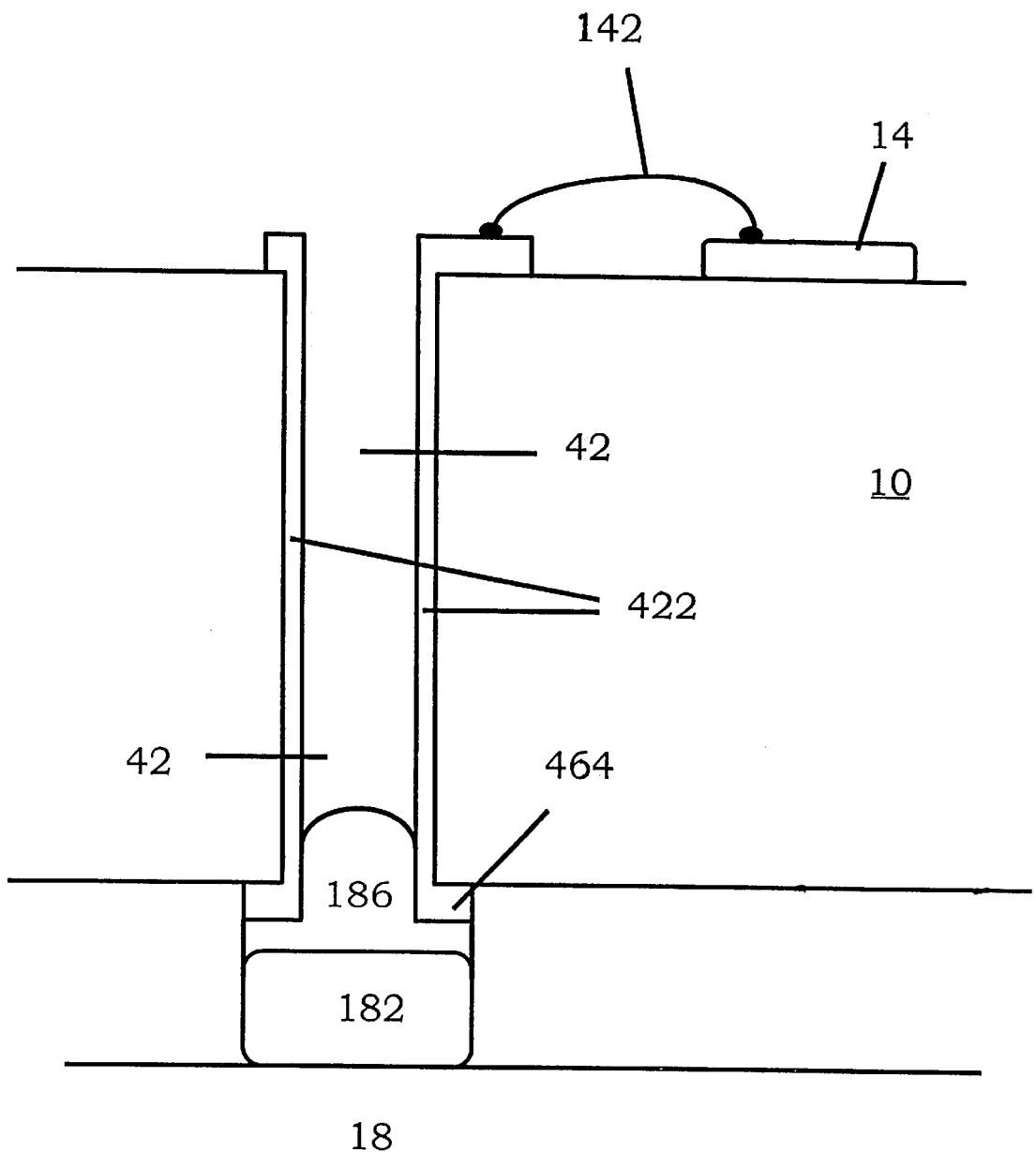
FIG. 12 shows the attachment to the mother board after soldering.

FIG. 12 shows that contact between the through hole 42 and the circuit contact 182 after soldering heat treatment. The soldering material melts and assumes a shape 186 to rise into the through hole 42. The output terminal 142 of the IC 14 is then connected to the mother board 18.

The foregoing embodiments are examples of the present invention. The invention is not limited to these examples. Any changes and modifications using the foregoing principle are all within the scope of this invention.

What is claimed is:

1. A semiconductor device flat package, comprising:
    an insulating substrate;
    a semiconductor device mounted on a top surface of said substrate;
    a conducting plated through hole tunneling through said substrate, having a top conducting flange hanging over said substrate and a bottom conducting flange extending along the bottom surface of the substrate and pressing against the bottom surface of said substrate,
    said top flange being interconnected to a terminal of the semiconductor device, and
    said bottom flange having a cavity which is recessed into the bottom surface of the substrate and which a melted solder fills to connect said bottom flange and a circuit contact of a motherboard and wherein said cavity is not aligned with the plated through hole.

2. A semiconductor device flat package as described in claim 1, wherein said semiconductor device is an integrated circuit chip.

3. A semiconductor device flat package as described in claim 1, wherein said top flange is interconnected to a terminal of the semiconductor device by wire bonding.

4. A semiconductor device flat package as described in claim 1, wherein said top flange is interconnected to a terminal of the semiconductor device by flip-chip bonding.

5. A semiconductor device flat package as described in claim 1 wherein said plated through hole has the same diameter as said cavity.

6. A semiconductor device flat package as described in claim 1, wherein said bottom flange has at least one cut slit to let air out during solder melting.

* * * * *